United States Patent [19]
Albean

[11] Patent Number: 5,373,562
[45] Date of Patent: Dec. 13, 1994

[54] SIGNAL PROCESSOR FOR STEROPHONIC SIGNALS

[75] Inventor: David L. Albean, Indianapolis, Ind.

[73] Assignee: Thomson Consumer Electronics, Inc., Indianapolis, Ind.

[21] Appl. No.: 937,489

[22] Filed: Aug. 28, 1992

[51] Int. Cl.$^5$ ............................................. H03G 7/00
[52] U.S. Cl. ...................................... 381/13; 381/106
[58] Field of Search ................... 381/13, 106; 358/144

[56] References Cited

U.S. PATENT DOCUMENTS 5,091,957  2/1992  Anderson et al. ................... 381/106

Primary Examiner—Forester W. Isen
Attorney, Agent, or Firm—Joseph S. Tripoli; Peter M. Emanuel; Frederick A. Wein

[57] ABSTRACT

An expander circuit for decoding audio signals which were encoded in accordance with the BTSC multichannel sound system standard including DBX companding is presented. A wideband expander circuit is utilized and a DBX expander can be accommodated. The wideband expander circuit is provided with a signal path having an input LPF (low pass filter), a stereo difference signal (L−R) demodulator, a second LPF, and a voltage controlled amplifier (VCA), the gain of which is controlled by a control signal derived from the demodulated difference signal which has been operated on by a bandpass filter (BPF) and an integrating peak detector. The output of the VCA is provided to a deemphasis network before being fed to a decoder matrix for combining with the sum stereo signal (L+R) for reconstructing the original L and R signals. When a DBX expander is connected, the DBX expander is substituted in place of the deemphasis network, the VCA control signal, which provides the wideband expansion, is overridden by a predetermined voltage, the bandpass filtering characteristic of the BPF is disabled, and the input is switched to bypass the input LPF. The disablement of the BPF filtering characteristic actuates the switching of the input to bypass the input LPF.

12 Claims, 5 Drawing Sheets

5,373,562

SIGNAL PROCESSOR FOR STEROPHONIC SIGNALS

FIELD OF THE INVENTION

The present application concerns television receivers having signal processing circuitry for decoding stereo signals which were encoded in accordance with the DBX ™ format.

BACKGROUND OF THE INVENTION

The present application relates to wideband expansion of stereophonic signals as discussed in U.S. Pat. No. 5,091,957 of Anderson et al. The teaching of the '957 patent is expressly incorporated by reference herein. The '957 patent disclosed a wideband expander, and recognized that for practical purposes, satisfactory restoration of an (L−R) audio difference signal companded according to the DBX format can be achieved without spectral expansion. A decoder according to '957 provides a modified fixed deemphasis and wideband expansion of the received compressed L−R audio signal, but does not provide spectral expansion. Additionally, it was further recognized in '957 that the relatively complex RMS detectors of the DBX system can be replaced with simpler, lower cost integrating peak detectors.

It is desirable to design and build television receivers wherein different decoders can be used depending upon model and options.

SUMMARY OF THE INVENTION

Briefly, the present invention concerns an expander circuit for decoding audio signals which were encoded in accordance with the BTSC multichannel sound system standard including DBX companding. A wideband expander circuit is utilized and a DBX expander can be accommodated. The wideband expander circuit is provided with a signal path having an input LPF (low pass filter), a stereo difference signal (L−R) demodulator, a second LPF, and a voltage controlled amplifier (VCA), the gain of which is controlled by a control signal derived from the demodulated difference signal which has been operated on by a bandpass filter (BPF) and an integrating peak detector. The output of the VCA is provided to a deemphasis network before being fed to a decoder matrix for combining with the sum stereo signal (L+R) for reconstructing the original L and R signals. When a DBX expander is connected, the DBX expander is substituted in place of the deemphasis network, the VCA control signal, which provides the wideband expansion, is overridden by a predetermined voltage, the bandpass filtering characteristic of the BPF is disabled, and the input is switched to bypass the input LPF. The disablement of the bandpass filtering characteristic of the BPF actuates the switching of the input to bypass the input LPF.

DETAILED DESCRIPTION OF THE EMBODIMENT

Figure 1:
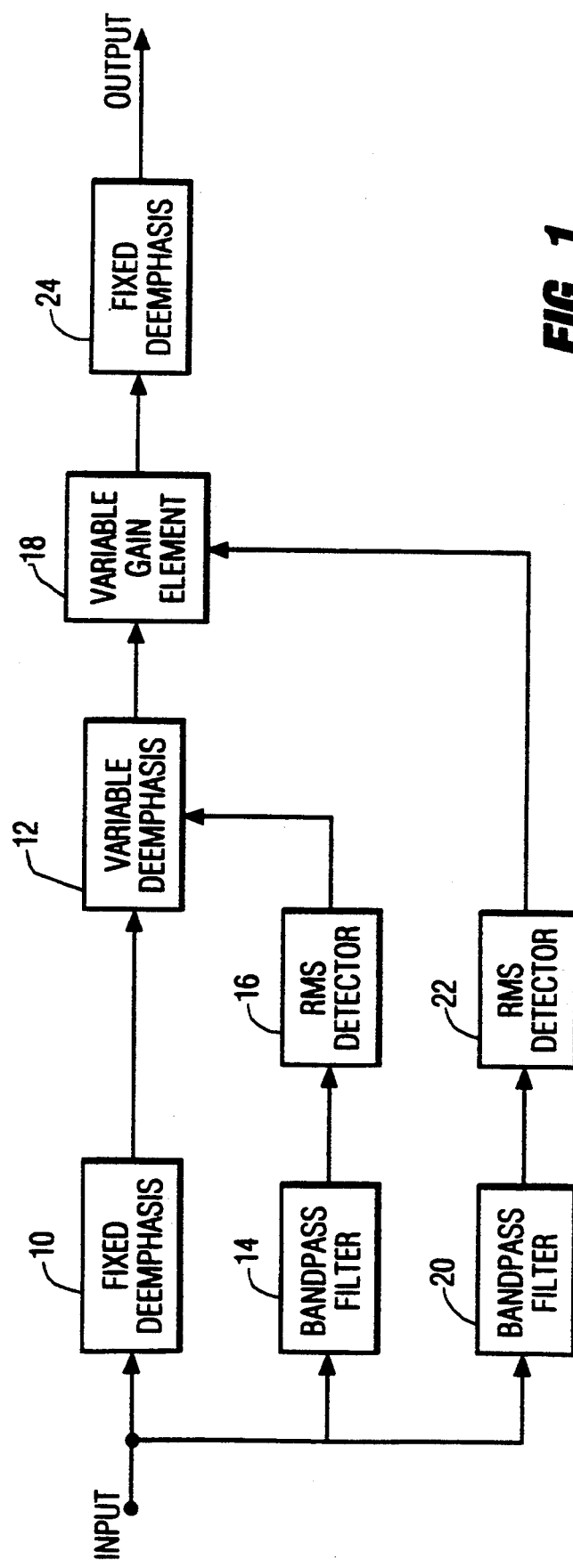
FIG. 1 shows a block diagram of a DBX expander as known in the prior art.

In the DBX system of FIG. 1, a fixed deemphasis is applied to the incoming (L−R) stereo difference signal, by fixed deemphasis unit 10. A spectral expansion is applied to the deemphasized audio signal by variable deemphasis unit 12 in response to a control signal developed by bandpass filter 14 and RMS detector 16. Amplitude expansion is applied to the audio signal by variable gain element 18 in response to a control signal developed by bandpass filter 20 and RMS detector 22. A fixed deemphasis (i.e., a fixed amount of low pass filtering) is applied to the expanded audio signal by fixed deemphasis unit 24 in order to attenuate high frequency products which may have been generated in the expansion process.

Figure 2:
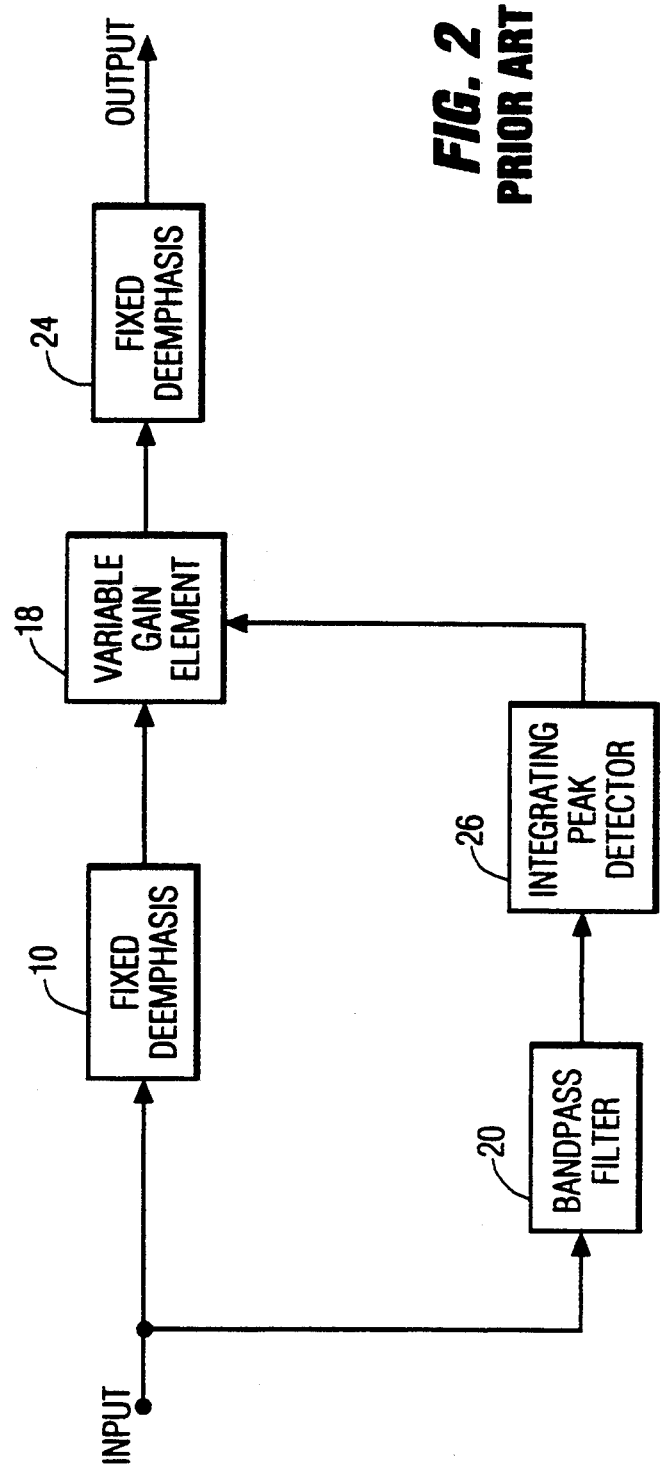
FIG. 2 shows a block diagram of a wideband expander.

FIG. 2 shows a wideband expander. The units of FIG. 2 having the same numerical designations as corresponding units of the decoder of FIG. 1, perform the same function as their counterparts. The wideband expansion provided by variable gain element 18 of FIG. 2 in response to control signals developed by units 20 and 26, substantially restores the dynamic range of the original signal.

Discussion of the significant differences between the arrangements of FIGS. 1 and 2 are stated in the '957 patent. Briefly, these differences are: 1) that the spectral expansion of the compressed DBX audio signal is not necessary for the reproduction of an acceptable stereo signal. Accordingly, the variable deemphasis unit 12, its associated control path filter 14, and its associated RMS detector 16 were completely eliminated from the arrangement of FIG. 21 2) that the rolloff frequency of the fixed deemphasis networks had been changed to compensate for some of the lost variable deemphasis caused by elimination of the spectral expansion elements, and 3) that the RMS detector 22 was replaced by a much lower cost and more simply constructed integrating peak detector 26.

Figure 3:
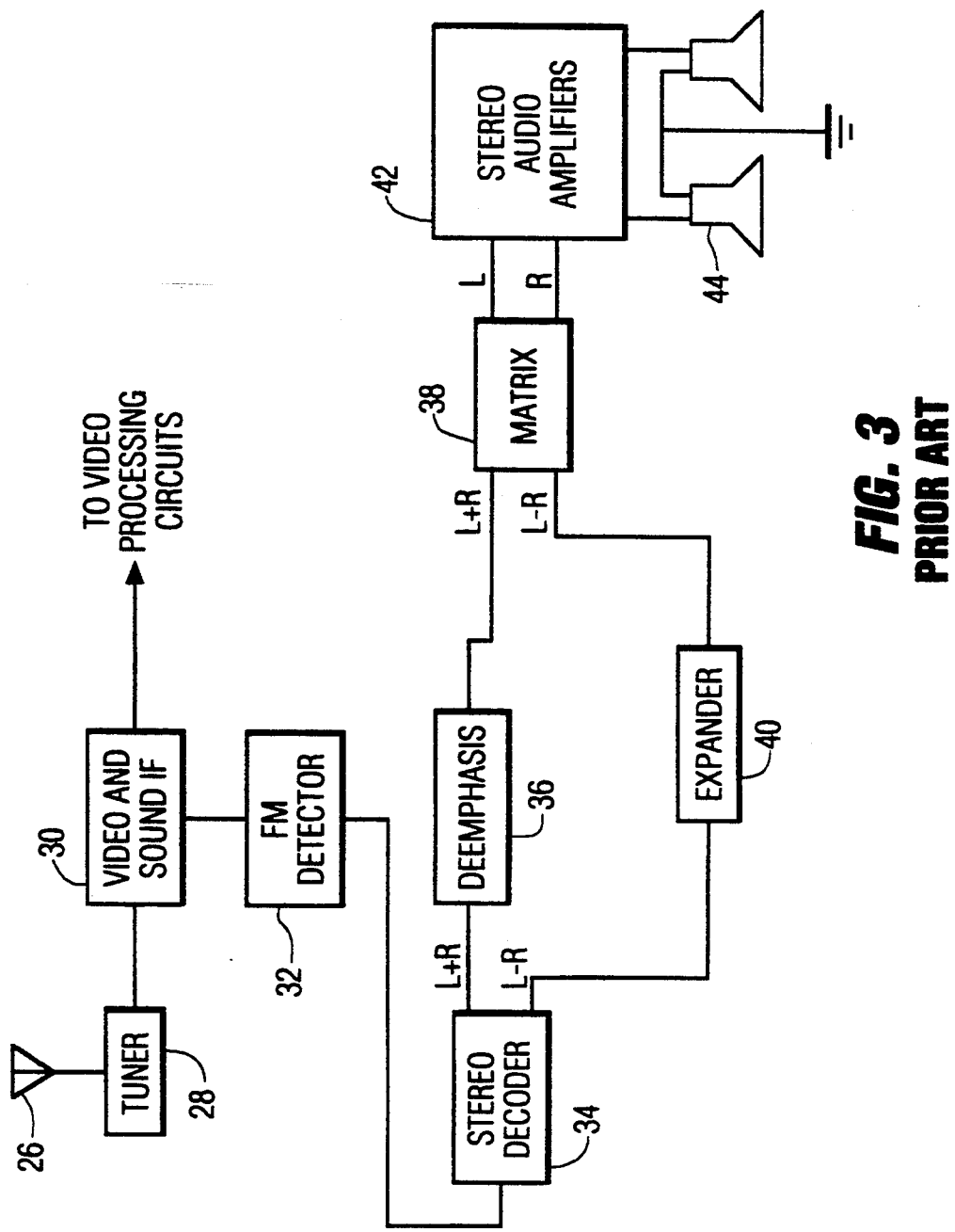
FIG. 3 show a block diagram of a television receiver having BTSC multichannel sound capability.

The expanders of FIGS. 1 and 2 have been used in television receivers known in the prior art. FIG. 3 shows such a television receiver having BTSC multichannel television sound (MTS) capability. Broadcast television signals are received by an antenna 26 (or coupled to the receiver via a cable television system) and applied to a tuner 28 for channel selection. Tuner 28 converts a selected one of a plurality of received television signals from its respective broadcast frequency to a common intermediate frequency (IF). The IF frequency television signal is applied to a video and sound IF unit 30 which produces a baseband video signal and a frequency modulated (FM) sound carrier. The video and audio signals are separated, and the video signals are applied to video signal processing circuitry, (not shown).

As shown in FIG. 3, a composite multichannel sound audio signal is detected from the FM sound carrier by an FM detector 32 and applied to a stereo decoder 34. Stereo decoder 34 provides an (L+R) stereo sum signal and an (L−R) stereo difference signal. The (L+R) stereo sum signal is deemphasized in a deemphasis unit 36 (i.e., a low pass filter having the appropriate time constant) and applied, to one input of a stereo matrixing unit 38 in which the original left (L) and right (R) stereo signals are reconstructed. The (L−R) stereo difference signal from stereo decoder unit 34 is applied to expander unit 40. Expander unit 40 can correspond to a full DBX expander as shown in FIG. 1 or to a wideband expander as shown in FIG. 2. The expanded (L−R) stereo difference signal is applied to the other input of stereo matrix unit 38. The reconstructed left (L) and right (R) stereo signals are applied to stereo audio amplifier unit 42 for amplification and ultimate reproduction in a dual speaker unit 44.

Figure 4:
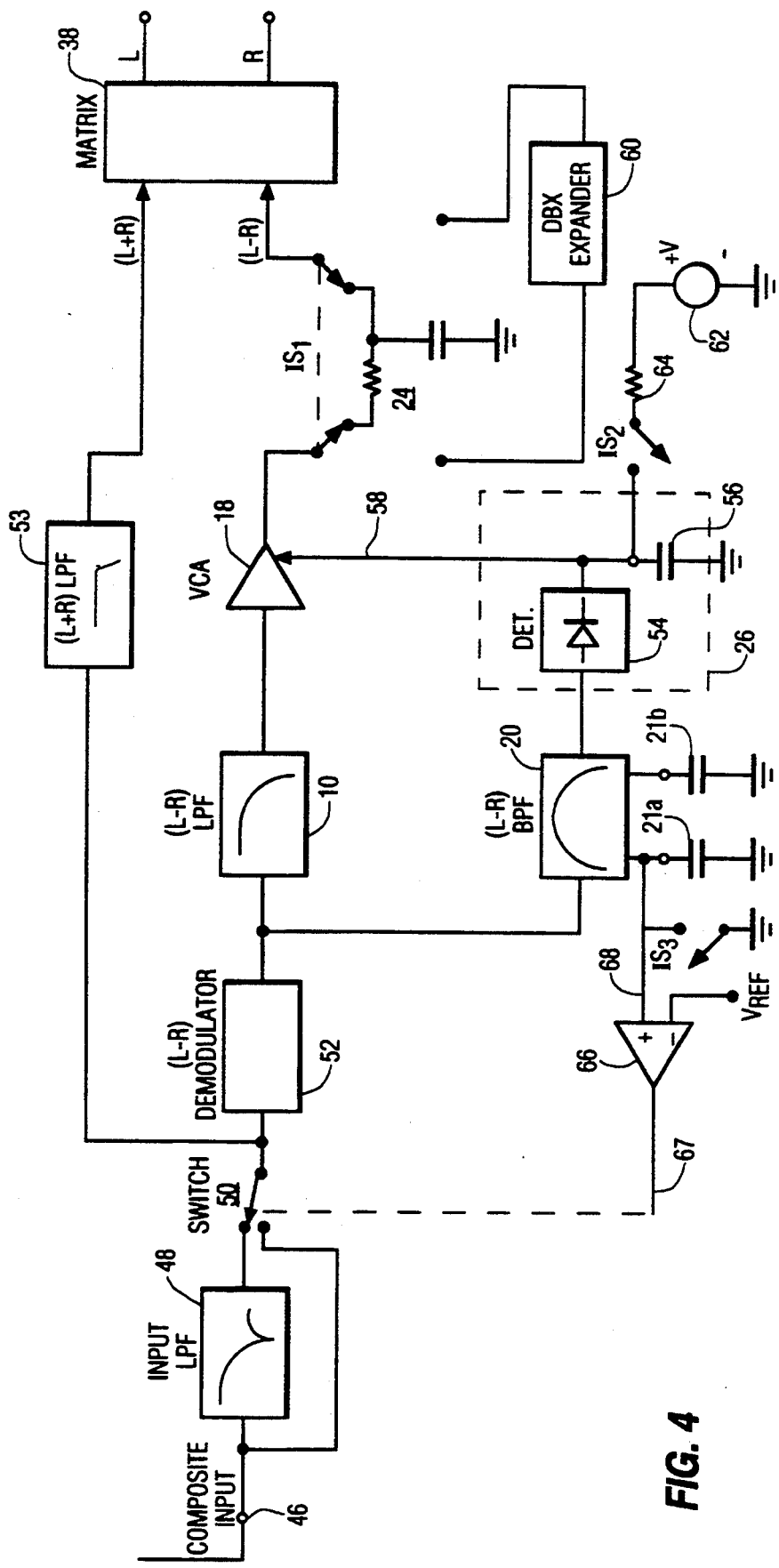
FIG. 4 shows a block diagram of a stereophonic difference signal processor according to aspects of the present invention.

FIG. 4 shows a wideband expander, generally designated 44, which according to aspects of the present invention, can be adapted so that a DBX expander can be used. A composite DBX encoded audio signal including a pilot signal is fed to the system at input terminal 46. The composite DBX encoded audio signal is then filtered by an input low pass filter (LPF) 48, which is a notch filter having its maximum attenuation at a frequency close to but higher than the fifth harmonic (5H) of the pilot signal. This filter is used because it is desirable to remove any SAP signal from the incoming composite signal since the SAP signal can cause interference with the operation of the (L−R) demodulator. This is because an (L−R) demodulator typically uses a phase-locked loop (PLL) and there is a possibility that the PLL will falsely lock onto the 5H center frequency of the SAP signal if the 5H signal is of sufficient amplitude.

The present LPF 48 is of a twin-T topology (not shown) with the the notch tuned to a frequency higher than 5H. In such an arrangement, the SAP signal can be sufficiently attenuated via the filter skirt without requiring close tolerance components to precisely determine the notch frequency. Additionally, placing the notch above the frequency of interest permits smaller capacitance values which are more practical to integrate and assures that R/C value variations will not change the skirt attenuation if a high enough "Q" is used. The present LPF 48 uses a portion of the twin-T arrangement as part of the feedback loop for an operational amplifier for increasing the Q of the circuit.

The output signal from LPF 48 is fed to a switch 50 for switching the input terminal of the (L−R) demodulator 52 between the output of LPF 48 and input terminal 46. In the exemplary embodiment, LPF 48 is bypassed when a DBX expander is used. When a DBX expander is used, a third order SALLEN-KEY LPF (not shown) can be used for providing sharper skirts at the notch frequency. The operation of switch 50 will be discussed in greater detail below.

The signal from switch 50 is fed to LPF 53 for deriving the stereo sum signal (L+R) which is subsequently fed to matrix 38. The signal from switch 50 is also provided to demodulator 52 which is a standard demodulator according to the MTS television standard. The output signal from demodulator 52 is fed to the series coupling of LPF 10 and VCA 18, as well as to the series coupling of BPF 20 and integrating peak detector 26, all of which correspond to similarly designated members shown in FIG. 2. Integrating peak detector 26 is comprised of an detector 54 and a integrating capacitor 56 for providing a integrated peak detected control signal at line 58 to VCA 18. The expanded output signal from VCA 18 is fed to a fixed deemphasis network 24 (see FIG. 2) which in turn is fed to a stereo matrix 38 for reconstructing the L and R signals.

The members so far described in connection with FIG. 4 for the (L−R) signal correspond with the wideband expander discussed in FIG. 2, as shown in the '957 patent. The wideband expander of FIG. 4 provides amplitude expansion for DBX encoded signals with an expander is not a mirror image of the encoder. However, it is recognized herein that it may be desirable to use selected portions of the present expander, e.g., demodulator 52, LPF 10, and VCA 18, when expansion from a DBX expander is utilized instead of wideband expansion. In such a case, some operations of the present expander would be modified to accommodate the operation of the DBX expander. Such circuitry changes are indicated in FIG. 4 as illustrative switches IS1, IS2, and IS3. These switches are designated as "illustrative" because it is expected that in practice, that such the alternate connections would be hard wired connections.

A DBX expander 60 would be wired in place of the emphasis network 24 and such substitution is shown by switch IS1. This substitution is made because the DBX expander 60 provides its own deemphasis and thus, emphasis network 24 is not needed.

In wideband expander 40, BPF 20 and integrating peak detector 26 provide a control voltage at line 58 to VCA 18 to provide amplitude expansion of the (L−R) signal. Since DBX expander 60 provides its own amplitude expansion of the signal, the amplitude expansion provided by the control voltage at line 58 is defeated by providing a constant predetermined voltage 62 through a resistor 64 to the output of the integrating peak detector 26 at line 58 by way of illustrative switch IS2. In this way, any changes in the control voltage at line 58 which would be caused by the (L−R) signal processing of BPF 20 and integrating peak detector 26, are "swamped" out by constant voltage 62. Thus, in this arrangement, VCA 18 provides a constant amplification with the amount of said amplification being predetermined by the value of the constant control voltage 62 applied at line 58.

As discussed above, switch 50 switches the input signal for demodulator 52 to bypass LPF 48 when a DBX expander 60 is used. In the exemplary embodiment, the switching of switch 50 is effectuated by the defeating of the bandpass operation of BPF 20. Such an arrangement will not adversely effect the operation of the system since any control signal generated by the operation of BPF 20 (and integrating detector 26) is rendered ineffectual by voltage source 62 and resistor 64. The frequency selective operation of BPF 20 is provided by capacitors 21a and 21b which provide a frequency sensitive network, and will be more fully discussed below. In the exemplary embodiment, capacitor 21a is coupled to a reference potential such as ground, and is provided with a DC voltage thereacross. This DC voltage is compared against a reference potential by comparator 66, which has an output 67 to which the switch position of switch 50 is responsive. The DC voltage across capacitor 21a, is of a value above a threshold reference voltage $V_{REF}$ coupled to the negative terminal of comparator 66. In such an arrangement, switch 50 is switched for receiving an input signal from LPF 48. If the DC voltage at line 68 is below $V_{REF}$, the output of comparator 66 causes switch 50 to be switched for receiving the input signal from terminal 46, bypassing LPF 48. In the exemplary embodiment, the DC voltage across capacitor 21a is changed by short circuiting the capacitor 21a to ground by illustrative switch IS3. However, a resistor can be used having a low enough value sufficient to change the voltage at line 68 through $V_{REF}$ from above $V_{REF}$ to below $V_{REF}$.

Figure 5:
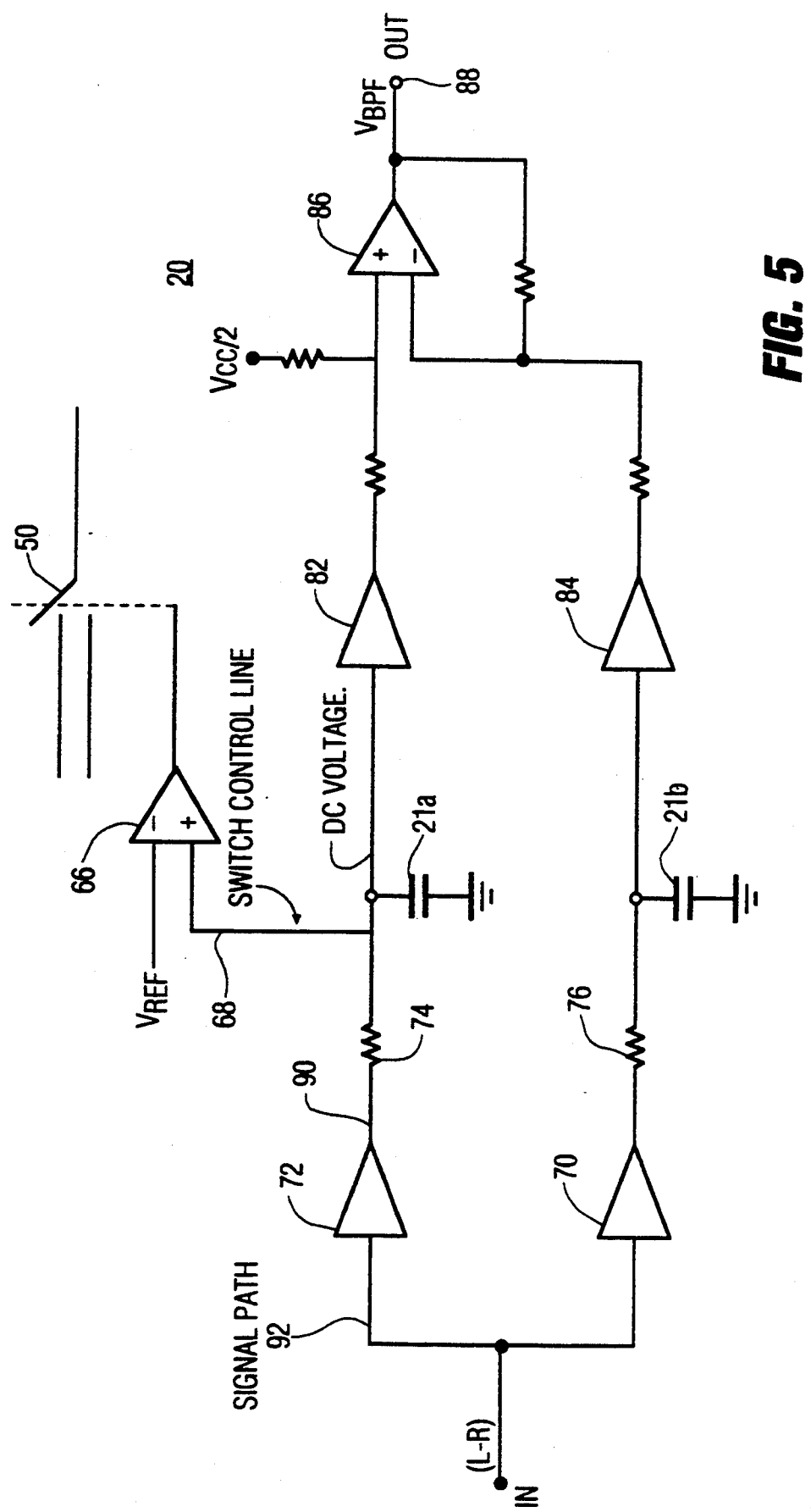
FIG. 5 is a block diagram showing details of the bandpass filter and switching apparatus of FIG. 4.

The details of BPF 20 are shown in FIG. 5. The (L−R) signal derived from the output of demodulator 52 is provided to unity amplifiers 70, 72 and in turn is fed to a respective pair of frequency sensitive low pass filters comprised of resistors 74, 76, and respective capacitors 21a, 21b to ground for providing low pass filtering. The output signals from the low pass filters are fed to respective unity gain amplifiers 82, 84 and subsequently to an operational amplifier 86 wherein one of the low pass filtered signals is provided to the non-inverting input terminal and the other low pass filtered signal is provided to the inverting input terminal. In such a case, when the two signals into amplifier 86 are equal, there is no output signal at terminal 88 of amplifier 86. If the signal fed to the inverting terminal has a rolloff at a lower frequency than the signal to the non-inverting terminal, the subtraction process is reduced past the rolloff frequency and the signal at the non-inverting terminal will be passed through to terminal 88 until the non-inverting input signal reaches its own rolloff frequency. In this way a bandpass filter is generated.

In the exemplary embodiment, the DC voltage across capacitor 21a at line 68 is provided from the output line 90 of amplifier 72 which is DC coupled and has a DC voltage thereat. Thus, when capacitor 21a is shunted or short circuited to ground through illustrative switch IS3, the operation of that signal path 90 is defeated, and consequently, the operation of the bandpass function of BPF 20 is defeated. The change of the DC voltage at line 68 causes switch 50 to switch between input signal terminals as discussed above.

What is claimed is:

1. A television receiver for decoding a audio stereophonic signals which have been encoded in accordance with the DBX companding system, said television receiver being able to accept a DBX expander, the television receiver comprising:

a first input terminal for receiving a composite DBX encoded audio signals including a pilot signal for demodulating the (L−R) signal, input filter means for filtering out a harmonic frequency of the pilot signal from the composite DBX encoded signal and providing a first filtered version of the composite DBX encoded signal at a first output terminal, means including a second input terminal for demodulating the first filtered version of the composite DBX encoded signal provided at the first output terminal for providing a DBX encoded (L−R) audio signal, means exhibiting a fixed lowpass filter characteristic and coupled for receiving said DBX encoded (L−R) audio signal, said lowpass filter means applying a fixed deemphasis to said encoded audio signal and producing a deemphasized audio signal at a first output;

means for amplifying audio signals, said amplifying means having a signal input coupled to said first output for receiving said deemphasized audio signals, having a control input for receiving a gain control signal, and having an output at which expanded signals .are developed in response to the gain control signal;

means exhibiting a bandpass filter characteristic and coupled to said input for receiving said DBX encoded (L−R) audio signals, and producing a control signal;

means for detecting the peak amplitude of said control signal, and having an output at which a peak detected control signal is developed;

means for integrating a signal, said integrating means having an input coupled to said output of said peak detecting means for receiving said peak detected control signal, and an output at which is developed said gain control signal, said output of said integrating means being coupled to said control input of said amplifier means; and a second means exhibiting a fixed lowpass filter characteristic and coupled to said output of said amplifier means for receiving said expanded audio signals, said second lowpass filter means applying a second fixed deemphasis to said expanded audio signals and producing further filtered audio signals at an output, the television receiver being couplable to a DBX expander, and when the television receiver is coupled to a DBX expander, said means exhibiting a bandpass filter characteristic is disabled, said DBX expander is substituted for the second means exhibiting a fixed lowpass filter characteristic, and said television receiver further comprises means for providing a constant gain control signal to said means for amplifying audio signals, said means for providing a constant gain control signal overriding the gain control signal provided by the means for detecting in combination with the means for integrating.

2. The television receiver of claim 1 wherein the second input terminal is switchable between the first output terminal and the first input terminal, and the disablement of the means exhibiting a bandpass filter characteristic when the television receiver is coupled to a DBX expander causes the second input terminal to be switched between the first output terminal to the first input terminal for bypassing the input filter means.

3. The television receiver of claim 2 wherein the means for exhibiting a bandpass filter characteristic includes a capacitor having a DC voltage applied thereacross, and the means for disabling the means exhibiting a bandpass filter characteristic comprises means for changing the DC voltage across the capacitor.

4. The television receiver of claim 3 wherein the DC voltage across the capacitor of the means for exhibiting a bandpass filter characteristic is applied to a comparator means which initiates the switching action of the switch when the DC voltage across the capacitor is changed.

5. In a television receiver, a wideband expander circuit for decoding audio stereophonic signals which were encoded in accordance with the BTSC multichannel sound system standard including DBX companding, the television receiver being able to accept a DBX expander, the television receiver comprising:

a first input terminal for receiving a composite DBX encoded audio signals including a pilot signal for demodulating the (L−R) signal, input filter means for filtering out a harmonic frequency of the pilot signal from the composite DBX encoded signal and providing a first filtered version of the composite DBX encoded signal at a first output terminal, means including a second input terminal for demodulating the first filtered version of the composite DBX encoded signal provided at the first output terminal for providing an DBX encoded (L−R) audio signal, means exhibiting a fixed lowpass filter characteristic and coupled for receiving said DBX encoded (L−R) audio signal, said lowpass filter means applying a fixed deemphasis to said encoded audio signals and producing a deemphasized audio signal at a first output, said lowpass filter characteristic exhibiting a rolloff at a frequency less than half of the rolloff frequency exhibited by fixed lowpass filters of a standard DBX system;

means for amplifying audio signals, said amplifying means having a signal input coupled to said first output for receiving said deemphasized audio signals, having a control input for receiving a gain control signal, and having an output at which expanded signals are developed in response to the gain control signal;

means exhibiting a bandpass filter characteristic, and coupled to said input for receiving said DBX encoded (L−R) audio signals, and producing a control signal at a second output;

means for detecting the peak amplitude of said control signal, and having an output at which a peak detected control signal is developed;

means for integrating a signal, said integrating means having an input coupled to said output of said peak detecting means for receiving said peak detected control signal, and an output at which is developed said gain control signal, said output of said integrating means being coupled to said control input of said amplifier means;

a second means exhibiting a fixed lowpass filter characteristic and coupled to said output of said amplifier means for receiving said expanded audio signals, said second lowpass filter means applying a second fixed deemphasis to said expanded audio signals and producing further filtered audio signals at an output.

the wideband expander circuit being couplable to a DBX expander, and when the expander circuit is coupled to a DBX expander, said means exhibiting a bandpass filter characteristic is disabled, said DBX expander is substituted for the second means exhibiting a fixed lowpass filter characteristic, and said wideband expander further comprises means for providing a constant gain control signal for said means for amplifying audio signals, said means for providing a constant gain control signal overriding the gain control signal provided by the means for detecting in combination with the means for integrating.

6. The television receiver of claim 5 wherein the second input terminal is switchable between the first output terminal and the first input terminal, and the disablement of the means exhibiting a bandpass filter characteristic when the television receiver is coupled to a DBX expander causes the second input terminal to be switched between the first output terminal to the first input terminal bypassing the input filter means.

7. The television receiver of claim 6 wherein the means for exhibiting a bandpass filter characteristic includes a capacitor having a DC voltage thereacross, and the means for disabling the means exhibiting a bandpass filter characteristic comprises means coupled across the capacitor for changing the DC voltage according to a threshold voltage.

8. The television receiver of claim 7 wherein the DC voltage across the capacitor of the means for exhibiting a bandpass filter characteristic is applied to a comparator means which initiates the switching action of a switch when the DC voltage passes through the threshold voltage.

9. In a television receiver, a wideband expander circuit for decoding audio signals which were encoded in accordance with the BTSC multichannel sound system standard including DBX companding, comprising:

means exhibiting a fixed lowpass filter characteristic and having an input for receiving said DBX encoded audio signals, said lowpass filter means applying a fixed deemphasis to said encoded audio signals and producing a deemphasized audio signal at a first output, said lowpass filter characteristic exhibiting a rolloff at a frequency less than half of the rolloff frequency exhibited by fixed lowpass filters of the DBX system;

means for amplifying audio signals, said amplifying means having a signal input coupled to said first output for receiving said deemphasized audio signals, having a control input for receiving a gain control signal, and having an output at which amplified signals are developed;

means exhibiting a bandpass filter characteristic, and having an input for receiving said DBX encoded audio signals, and producing a control signal at a second output;

means for detecting the peak amplitude of a signal, said peak detecting means having an input coupled to said second output for receiving said control signal, and having an output at which a peak detected control signal is developed, said output of said peak detecting means being coupled to said control input of said amplifier means, and a second means exhibiting a fixed lowpass filter characteristic and coupled to said output of said amplifier means for receiving said expanded audio signals, said second lowpass filter means applying a second fixed deemphasis to said expanded audio signals and producing further filtered audio signals at an output, the wideband expander circuit being couplable to a DBX expander, and when the expander circuit is coupled to a DBX expander, said means exhibiting a bandpass filter characteristic is disabled, said DBX expander is substituted for the second means exhibiting a fixed lowpass filter characteristic, and said wideband expander further comprises means for providing a constant gain control signal for said means for amplifying audio signals, said means for providing a constant gain control signal overriding the gain control signal provided by the means for detecting.

10. The television receiver of claim 9 wherein the input for receiving the DBX encoded audio signals is a switchable input terminal, and the disablement of the means exhibiting a bandpass filter characteristic when the television receiver is coupled to a DBX expander causes the input terminal to be switched.

11. The television receiver of claim 10 wherein the means for exhibiting a bandpass filter characteristic includes a capacitor having a DC voltage thereacross, and the means for disabling the means exhibiting a bandpass filter characteristic comprises means coupled across the capacitor.

12. The television receiver of claim 11 wherein the DC voltage across the capacitor of the means for exhibiting a bandpass filter characteristic is applied to a comparator means which initiates the switching action of a switch when the DC voltage passes through a threshold voltage.

* * * * *